United States Patent
Wen

[11] Patent Number: 6,015,756
[45] Date of Patent: Jan. 18, 2000

[54] TRENCH-SHAPED READ-ONLY MEMORY AND ITS METHOD OF FABRICATION

[75] Inventor: Jemmy Wen, Hsinchu, Taiwan

[73] Assignee: United Microelectronics Corporaiton, Taiwan

[21] Appl. No.: 08/898,943

[22] Filed: Jul. 23, 1997

Related U.S. Application Data

[62] Division of application No. 08/629,632, Apr. 9, 1996, Pat. No. 5,831,314.

[51] Int. Cl.⁷ .................................................. H01L 21/8246
[52] U.S. Cl. .............................................. 438/695; 438/700
[58] Field of Search ......................... 438/766, 723, 438/731, 695, 700, 270, 272, 276, 279

[56] References Cited

U.S. PATENT DOCUMENTS

| | | | |
|---|---|---|---|
| 3,873,373 | 3/1975 | Hill | 438/766 |
| 4,178,396 | 12/1979 | Okano et al. | 438/723 |
| 4,343,676 | 8/1982 | Tarng | 438/695 |
| 4,690,729 | 9/1987 | Douglas | 438/695 |
| 4,702,795 | 10/1987 | Douglas | 438/695 |

*Primary Examiner*—Robert Kunemund
*Assistant Examiner*—Duy-Vu Deo
*Attorney, Agent, or Firm*—Fish & Richardson P.C.

[57] ABSTRACT

The present invention utilizes a first dielectric layer and a second dielectric layer overlying cell regions for storing a turned-off state or a turned-on state, respectively. The first dielectric layer is formed by local oxidation of polysilicon having a thickness greater than that of the second dielectric layer, such that the corresponding cell regions below the first dielectric layer have a threshold voltage greater than that of the second dielectric layer. Moreover, the formation of the first dielectric layer can lower the parasitic capacitance between the word lines and the bit lines as well as the substrate. Furthermore, the present invention does not require code-implantation. Thus, decreased breakdown voltage encountered in the conventional method can be avoided.

14 Claims, 4 Drawing Sheets

TRENCH-SHAPED READ-ONLY MEMORY AND ITS METHOD OF FABRICATION

This is a divisional of application Ser. No. 08/629,632, filed Apr. 9, 1996, now U.S. Pat. No. 5,831,314.

BACKGROUND OF THE INVENTION

1. Field of the Invention

The present invention generally relates to a semiconductor device. More particularly, the present invention relates to a trench-shaped read-only memory having decreased parasitic capacitance. In addition, a method for fabricating the trench-shaped read-only memory is provided.

2. Description of the Related Art

Masked ROMs are nonvolatile memories into which memory states are permanently stored in accordance with custom masks during fabrication. Usually, each memory cell is implemented by a MOS (metal-oxide-semiconductor) transistor. In a masked ROM device, the channel region of a memory cell is selectively implanted with ions to adjust the threshold voltage thereof depending on whether the programmed memory cell is turned on or turned off, to represent a logic "1" or a logic "0" in binary code, respectively.

Referring to FIGS. 1A–1B, the conventional method for fabricating a read-only memory is depicted in cross-sectional views. A semiconductor substrate 1, such as a P-type silicon substrate, is first provided. As shown in FIG. 1A, a pad oxide layer 10 and a silicon nitride layer 11 are subsequently formed over the substrate 1. Then, the silicon nitride layer 11 is patterned and etched by photolithography to define the range of an active region 100 as depicted in FIG. 1A. Afterwards, thermal oxidation of the substrate 1 not covered by the patterned silicon nitride layer 11 forms field oxides 12 as isolating structures. This oxidation step is a so-called LOCOS (local oxidation of silicon) technology. Consequently, the active region 100 is automatically disposed between the field oxides 12.

The silicon nitride layer 11 and the pad oxide layer 10 are thereafter removed to expose the substrate 1. Furthermore, impurities, such as phosphorus-containing or arsenic-containing ions, are implanted into the substrate 1 to form a plurality of N-type bit lines 13 mutually spaced apart in parallel. As is well known in this art, a photoresist layer (not shown in the drawing) with the bit-line pattern should be formed on the substrate 1 prior to the implantation process. Then, thermal oxidation of the surface of the substrate 1 and the bit lines 13 forms dielectric layers 14 and 15, respectively. In particular, the dielectric layers 15 over the bit lines 13 have a thickness greater than the dielectric layers 14 because the doping concentration of the bit lines 13 is heavier than that of the substrate 1 resulting in a higher oxidation rate. Moreover, a polysilicon layer is deposited, as depicted in FIG. 1B, to overlie the field oxides 12 and dielectric layers 14, 15, and is thereafter patterned to form a plurality of word lines 16 spaced apart in parallel. The substrate 1 below each word line 16 and between two adjacent bit lines 13 is the channel region of a memory cell. The bit lines 13 disposed at two ends of the channel region serve as a drain region and a source region, respectively, and the word line 16 thereabove serves as a gate electrode of the memory cell.

Next, as depicted in FIG. 1B, a photoresist layer 110 is formed over the substrate 1 and patterned, in accordance with the customer masks, through photolithography to expose the channel regions to be implanted. After that, by utilizing the photoresist layer 110 as masking, ions 17, such as $BF_2^+$ or $B_{11}^+$, are implanted into the substrate 1 to increase the threshold voltage of the channel regions not covered by the photoresist layer 110 to form a first state region 18. The remainder covered by the photoresist layer 110 is a second state region 19.

Nevertheless, the thickness of the dielectric layer 15 is restricted by oxidation rate as well as the doping concentration of the bit lines 13, which can not effectively decrease the parasitic capacitance between the word lines 16 and the bit lines 13 as well as the substrate 1. In addition, the lateral diffusion that occurs in the bit lines 13 during the formation of the dielectric layers 14 and 15 hinders the application of this structure to high-density read-only memory devices.

SUMMARY OF THE INVENTION

Therefore, it is an object of the present invention to provide a trench-shaped read-only memory for decreasing parasitic capacitance between word lines and bit lines so as to lower the transmission delay via the word lines.

It is another object of the present invention to provide a method for fabricating the above-mentioned trench-shaped read-only memory without resorting to a code-implantation procedure.

Accordingly, the present invention achieves the above-identified object by providing a read-only memory for storing a first memory state and a second memory state, comprising: a semiconductor substrate; a plurality of trenches formed in the substrate and spaced apart to define a cell region between each two adjacent trenches; a plurality of bit lines filling in the trenches, respectively; a first dielectric layer covering the cell regions for storing the memory first state; a second dielectric layer covering the cell regions for storing the second memory state; and a plurality of word lines over the first and second dielectric layers.

Furthermore, the present invention achieves the above-identified object by providing a method for fabricating a read-only memory of storing a first state and a second state, comprising the steps of:

(a) providing a silicon substrate;

(b) patterning and etching the substrate to form a plurality of spaced apart trenches to define a cell region between each two adjacent trenches;

(c) forming a silicon layer filling in the trenches to form a plurality of bit lines therein, the bit lines overlying the substrate;

(d) forming a shielding layer on the silicon layer to cover the cell regions storing the second state;

(e) forming a first dielectric layer overlying the cell regions storing the first state by oxidizing the silicon layer not covered by the shielding layer;

(f) removing the shielding layer;

(g) forming openings to expose the cell regions storing the second state by etching the silicon layer using the first dielectric layer as masking;

(h) forming a second dielectric layer overlying the openings; and (i) forming a plurality of word lines over the first and second dielectric layers.

BRIEF DESCRIPTION OF THE DRAWINGS

Other objects, features and advantages of the present invention will become apparent by way of the following detailed description of the preferred but non-limiting embodiment. The description is made with reference to the accompanying drawings, wherein.

DESCRIPTION OF THE PREFERRED EMBODIMENTS

Referring to FIGS. 2A–2E, the processing flow of one preferred embodiment, in accordance with the present invention, is depicted in cross-sectional views. The method of the present invention fabricates a trench-shaped read-only memory in a semiconductor substrate 2, such as a P-type or an N-type silicon substrate. This embodiment makes use of a P-type silicon substrate as exemplified.

Figure 1A:
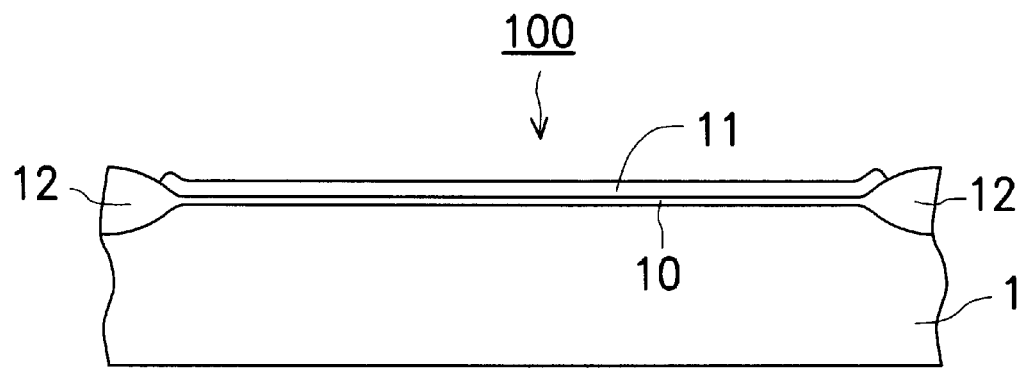
FIGS. 1A–1B (Prior Art) depict a conventional method for fabricating a read-only memory in cross-sectional views.
Figure 1B:
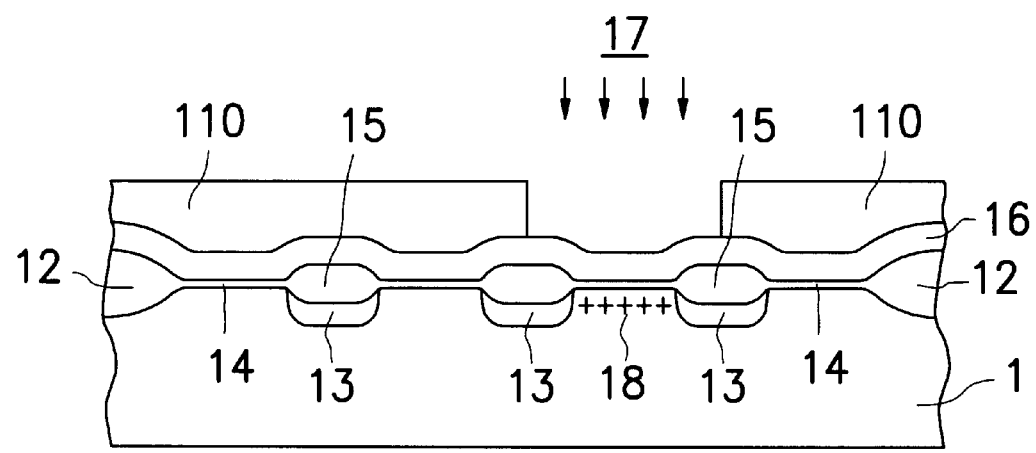
Figure 2A:
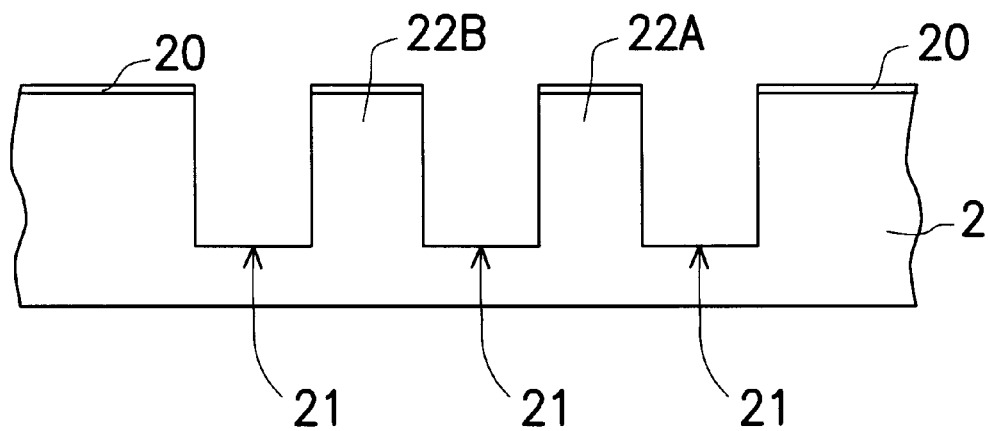
FIGS. 2A–2E depict the processing flow of one preferred embodiment, in accordance with the present invention, in cross-sectional views.
Figure 2B:
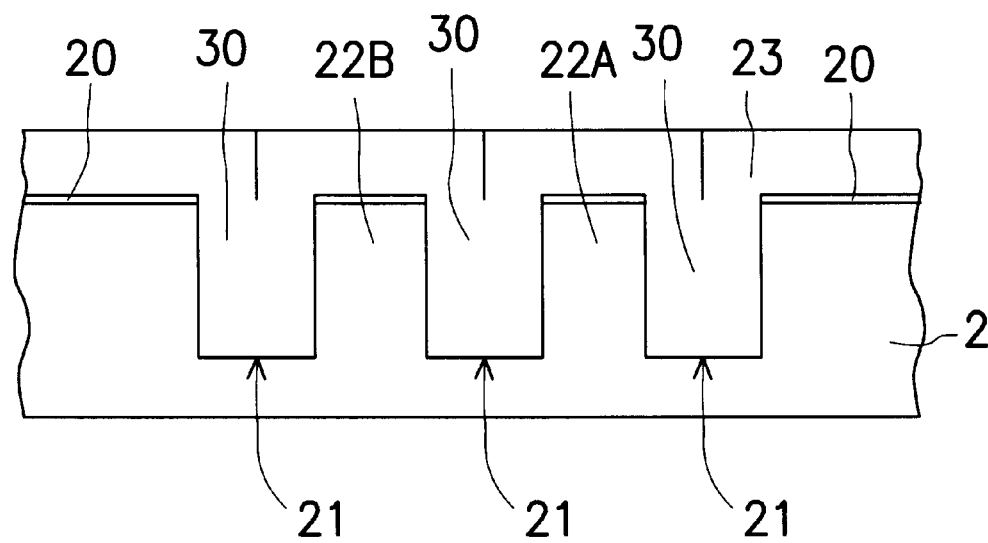

First, as shown in FIG. 2A, an insulating layer 20, such as a silicon oxide layer or a silicon nitride layer, is formed on the substrate 2. The thickness of the insulating layer 20 ranges from about 300 Å to 1000 Å. Then, the insulating layer 20 is patterned and etched by photolithography. Using the patterned insulating layer 20 as masking, the substrate 2 is etched into a plurality of trenches 21 spaced apart in parallel. The depth of those trenches ranges from about 0.4 µm to about 5 µm. Next, as depicted in FIG. 2B, a silicon layer 23 is deposited onto the insulating layer 20, and simultaneously filled into the trenches 21. Preferably, the silicon layer 23 is a doped polysilicon layer having a thickness of about 1000–5000 Å. If the conductivity type of the substrate 2 is P-type, the impurities contained in the doped polysilicon layer 23 are N-type. Note that the plugging portions 30 filling the trenches 21 serves as bit lines, respectively. Accordingly, cell regions 22 are defined between two adjacent bit lines 30.

Figure 2C:
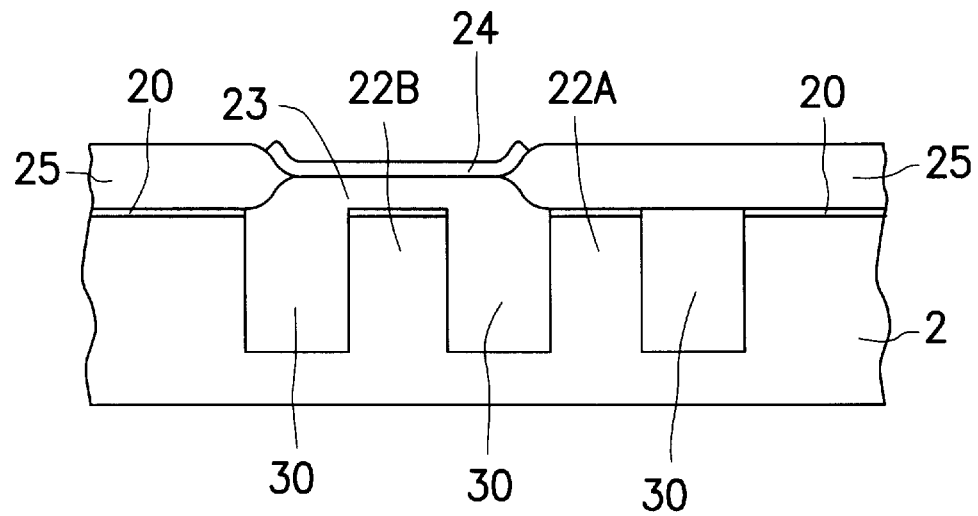

Moreover, based on customer codes, a shielding layer 24 (FIG. 2C) is formed on the silicon layer 23 to cover the cell region 22 storing a turned-on state. For instance, the shielding layer 24 might be a silicon nitride layer and preferably forms a pad oxide layer (not shown in the drawing) therebelow for decreasing the stress in contact with the underlying layer. As depicted in FIG. 2C, by utilizing the shielding layer 24 as masking, the silicon layer 23 not covered by the shielding layer 24 is thoroughly oxidized to form a first dielectric layer 25 to cover the cell regions 22A storing a turned-off state.

Figure 2D:
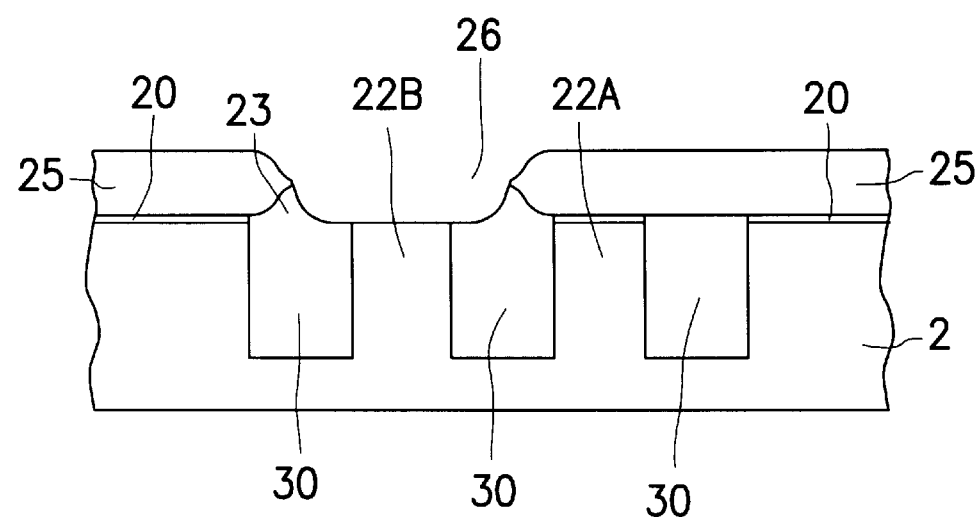
Figure 2E:
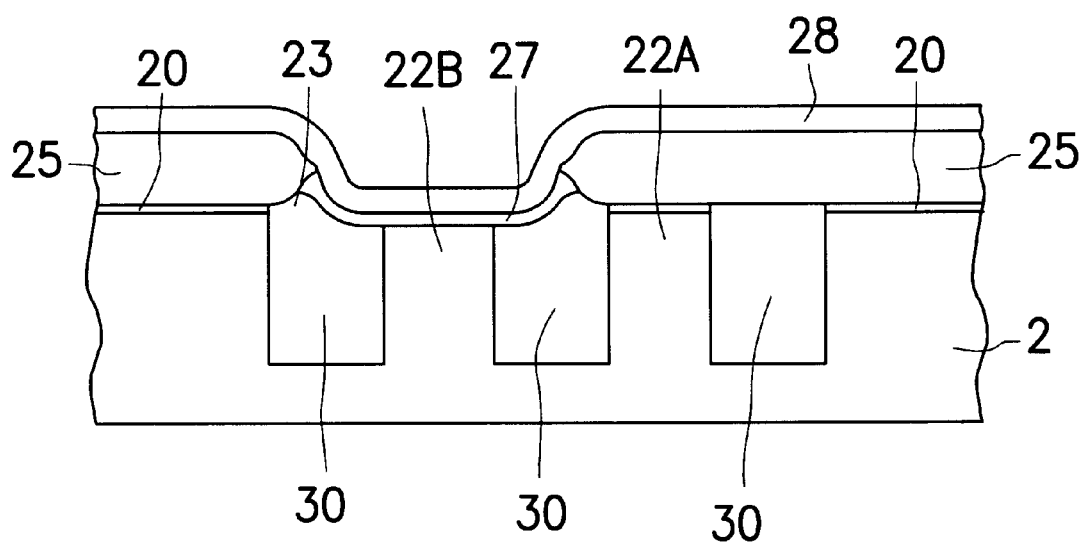

The shielding layer 24 is thereafter removed. As shown in FIG. 2D, utilizing the first dielectric layer 25 as masking, the silicon layer 23 is etched to form a opening 26 by using the insulating layer 20 as a etching stop. Owing to the etching selectivity between the first dielectric layer 25 (e.g., silicon oxide) and the silicon layer 23 (e.g., polysilicon), the opening 26 reveals graded sidewalls which are beneficial to the step coverage during sequential processing steps. The insulating layer 20 disposed at the bottom of the opening 26 is thereafter removed to expose the cell region 22B storing a turned-on state. Afterwards, a second dielectric layer 27 (FIG. 2E), having a thickness of about 50–300 Å, is formed along the periphery of the opening 26 by thermal oxidation. Subsequently, a polysilicon layer is deposited and patterned to shape a plurality of word lines 28 spaced apart in parallel. Usually, the extending direction of those word lines 28 is substantially orthogonal to that of the bit lines 30. Accordingly, the top portion of each cell region constitutes the channel region of a memory cell. By means of the formation of the first and second dielectric layers 25 and 27, the threshold voltage is programmed depending on whether the programmed memory cell is turned-on or turned-off, to represent a logic "1" or a logic "0" in binary code, respectively, as depicted in FIG. 2E.

In conclusion, the present invention utilizes a first dielectric layer and a second dielectric layer to overlie the cell regions storing a turned-off state or a turned-on state, respectively. The first dielectric layer is formed by local oxidation of polysilicon having a thickness greater than the second dielectric layer. Consequently, the corresponding cell regions below the first dielectric layer have a threshold voltage greater than that of the second dielectric layer. Moreover, the formation of the first dielectric layer can lower the parasitic capacitance between the word lines and the bit lines as well as the substrate. Furthermore, the present invention does not require code-implantation. Thus, decreased breakdown voltage encountered in the conventional method can be avoided.

What is claimed is:

1. A method for fabricating a read-only memory for storing a first memory state and a second memory state, comprising the steps of:

(a) providing a silicon substrate;

(b) patterning and etching said substrate to form a plurality of spaced apart trenches to define a plurality of cell regions between each two adjacent said trenches, wherein the cell regions include a first cell region storing said first memory state and a second cell region storing said second memory state;

(c) forming a silicon layer filling in said trenches to form a plurality of bit lines therein, said bit lines overlying said substrate;

(d) forming a shielding layer on said silicon layer to cover said second cell region storing said second memory state;

(e) forming a first dielectric layer overlying said first cell region storing said first memory state but not overlying said second cell region storing said second memory state, said first dielectric layer formed by oxidizing said silicon layer not covered by said shielding layer;

(f) removing said shielding layer;

(g) forming openings to expose said second cell region storing said second memory state by etching said silicon layer utilizing said first dielectric as masking;

(h) forming a second dielectric layer overlying said openings; and (i) forming a plurality of word lines over said first and second dielectric layers.

2. The method as claimed in claim 1, between steps (a) and (b), further comprising:

forming an insulating layer on said substrate;

patterning and etching said insulating layer with a pattern of said trenches.

3. The method as claimed in claim 2, wherein said insulating layer is a silicon oxide layer.

4. The method as claimed in claim 2, wherein said insulating layer is a silicon nitride layer.

5. The method as claimed in claim 1, wherein said silicon layer is a doped polysilicon layer.

6. The method as claimed in claim 5, wherein said second dielectric layer is formed by thermally oxidizing said polysilicon silicon layer on the periphery of said opening.

7. The method as claimed in claim 1, wherein said shielding layer is made of silicon nitride.

8. The method as claimed in claim 1, wherein said first dielectric layer has a thickness greater than a thickness of said second dielectric layer.

9. The method as claimed in claim 8, wherein said first and second dielectric layers are made of silicon oxide.

10. The method as claimed in claim 8, wherein said first memory state is a turned-off state, and said second memory state is a turned-on state.

11. The method as claimed in claim 1, wherein said word lines are made of polysilicon.

12. The method as claimed in claim 1, wherein said opening is self-alignedly formed by etching by utilizing said first dielectric layer as a mask.

13. The method as claimed in claim 1, wherein said openings have graded sidewalls.

14. The method as claimed in claim 1, wherein the trenches formed in step (b) have sidewalls, and forming a silicon layer filling in said trenches in step (c) comprises forming a silicon layer filling in said trenches directly in contact with the sidewalls of the trenches.

* * * * *